(12) United States Patent
Miyake et al.

(10) Patent No.: US 9,693,450 B2
(45) Date of Patent: Jun. 27, 2017

(54) PRINTED WIRING BOARD, SEMICONDUCTOR DEVICE AND PRINTED CIRCUIT BOARD

(71) Applicant: CANON KABUSHIKI KAISHA, Tokyo (JP)

(72) Inventors: Hiroyuki Miyake, Kawasaki (JP); Yusuke Murai, Kawasaki (JP); Kiyoshi Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/944,051

(22) Filed: Nov. 17, 2015

(65) Prior Publication Data

US 2016/0143133 A1  May 19, 2016

(30) Foreign Application Priority Data

Nov. 19, 2014  (JP) .................................. 2014-234445

(51) Int. Cl.
| | |
|---|---|
| *H05K 1/11* | (2006.01) |
| *H05K 1/02* | (2006.01) |
| *H01L 23/498* | (2006.01) |
| *H05K 1/18* | (2006.01) |

(52) U.S. Cl.
CPC ..... *H05K 1/0298* (2013.01); *H01L 23/49838* (2013.01); *H05K 1/113* (2013.01); *H05K 1/181* (2013.01); *H01L 23/49822* (2013.01); *H01L 2924/0002* (2013.01); *H05K 2201/09418* (2013.01)

(58) Field of Classification Search
CPC ...... H05K 1/0298; H05K 1/181; H05K 1/113; H05K 2201/09418; H01L 23/49838; H01L 23/49822; H01L 2924/00; H01L 2924/0002
See application file for complete search history.

(56) References Cited

U.S. PATENT DOCUMENTS

| | | | | |
|---|---|---|---|---|
| 5,784,262 | A * | 7/1998 | Sherman | H05K 1/114 174/261 |
| 6,373,139 | B1 * | 4/2002 | Clark | H01L 23/49838 257/737 |
| 6,404,460 | B1 * | 6/2002 | Chen | H04N 5/208 348/606 |
| 6,407,344 | B1 * | 6/2002 | Horiuchi | H01L 23/49838 174/261 |
| 6,992,374 | B1 * | 1/2006 | Yang | H05K 1/0231 257/678 |

(Continued)

FOREIGN PATENT DOCUMENTS

JP           H0669371 A      3/1994

*Primary Examiner* — Hoa C Nguyen
(74) *Attorney, Agent, or Firm* — Canon U.S.A. Inc., IP Division

(57) ABSTRACT

A printed wiring board includes conductive layers laminated with insulator layers interposed. A land group including a plurality of lands arranged with intervals between each other, is formed in a rectangular region on a surface layer, among the plurality of conductive layers, when viewed in a direction perpendicular to the surface layer. The land group is arrayed in a triangular lattice manner. The land group is arranged so that a smallest angle, among angles formed between one side of the rectangular region and respective three sides of the triangular lattice, is 7° or more and 23° or less.

9 Claims, 7 Drawing Sheets

(56) References Cited

U.S. PATENT DOCUMENTS

| | | | |
|---|---|---|---|
| 2004/0080034 A1* | 4/2004 | Satomi | H01L 23/3121 |
| | | | 257/678 |
| 2006/0172566 A1* | 8/2006 | Nakajima | H05K 1/111 |
| | | | 439/67 |
| 2008/0291651 A1* | 11/2008 | Figaro | H05K 3/0005 |
| | | | 361/777 |
| 2009/0065907 A1* | 3/2009 | Haba | H01L 21/76898 |
| | | | 257/621 |
| 2010/0007008 A1* | 1/2010 | Sano | H01L 23/49816 |
| | | | 257/692 |
| 2011/0155434 A1* | 6/2011 | Reynov | H05K 1/114 |
| | | | 174/261 |

* cited by examiner

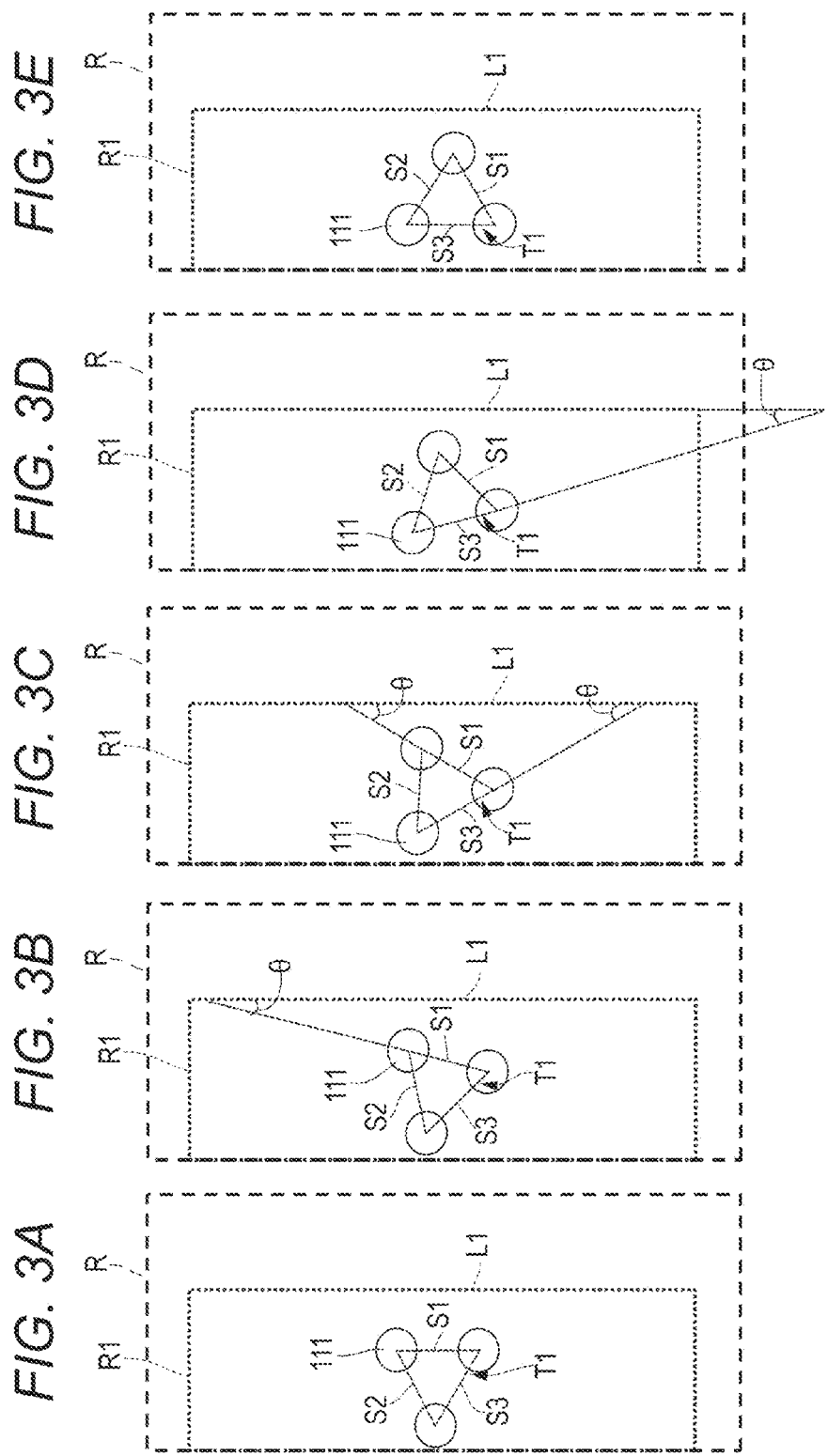

PRINTED WIRING BOARD, SEMICONDUCTOR DEVICE AND PRINTED CIRCUIT BOARD

BACKGROUND OF THE INVENTION

Field of the Invention

The present invention relates to a printed wiring board on which a semiconductor device is mounted, a semiconductor device mounted on a printed wiring board, and a printed circuit board including a printed wiring board and a semiconductor device.

Description of the Related Art

In recent years, multi-functionalization of electronic apparatuses has been accelerated. Accordingly, in a semiconductor device mounted on a printed wiring board within the electronic apparatus, input terminals or output terminals (input/output terminals) that input or output signals have a tendency of increasing in number to realize various functions. Moreover, as performance of the electronic apparatus has been improved, a bandwidth for signal transmission of an electric signal has been increased in the semiconductor device mounted on the printed wiring board within the electronic apparatus. In order to increase the bandwidth for signal transmission, a method of providing a plurality of signal lines is used, which tends to increase the number of the input/output terminals of the semiconductor device. A means for securing the required number of the terminals for the semiconductor device includes a method of increasing an area of a wiring substrate of the semiconductor device, and a method of increasing the number of terminals per unit area by reducing intervals between the terminals.

However, as the area of the wiring substrate of the semiconductor device is expanded, a cost or a size of an apparatus on which the semiconductor device (printed circuit board) is mounted becomes larger. In addition, too short intervals between the terminals have a risk of lowering mounting reliability of the semiconductor device.

In Japanese Patent Application Laid-Open No. 6-069371, as a method for increasing the number of the terminals per unit area in the wiring substrate of the semiconductor device while securing intervals between the terminals in the semiconductor device, a method of arranging adjacent terminals so as to form an equilateral triangle has been proposed.

However, Japanese Patent Application Laid-Open No. 6-069371 describes the terminals to be arranged in an equilateral triangle, but does not describe how the terminals arrayed in an equilateral triangle are arranged relative to one of four sides of the wiring substrate having a substantially quadrangular shape in the semiconductor device.

In a typical semiconductor device, the terminals being adjacent to each other are arranged so as to form a square, and a terminal group including the plurality of terminals is arranged so as to fill a rectangular region so that intervals between the terminals are secured. In this case, one of four sides of the rectangular region and one side of the square of the terminal array are arranged so as to be parallel to each other. Accordingly, also in the semiconductor device described in Japanese Patent Application Laid-Open No. 6-069371, it can be considered that one side of the rectangular region in which the terminal group is arranged and one side of the equilateral triangle of the terminal array are arranged so as to be parallel to each other.

With such terminal array, in the printed wiring board, a difference in wiring density is generated between leading wires led out from one side of a rectangular region surrounding a land group to which the terminal group of the semiconductor device is coupled, and leading wires led out from an adjacent side. Leading directions in which the leading wires are led out are thus restricted, lowering the degree of freedom in design. Therefore, there has been a need to reduce a difference in the number of leading wires caused between the leading directions in the printed wiring board.

In addition, in the printed wiring board, the aforementioned land group array is capable of increasing the number of lands constituting the land group, but is not capable of sufficiently increasing the total number of the leading wires led outside from the rectangular region surrounding the land group.

An object of the present invention is to provide a printed wiring board, a semiconductor device, and a printed circuit board configured to maintain a terminal density per unit area and reduce a difference in the number of leading wires caused between the leading directions in the printed wiring board so that the degree of freedom in design is improved and the total number of leading wires is increased.

SUMMARY OF THE INVENTION

A printed wiring board according to an embodiment of the present invention includes a plurality of conductive layers laminated with insulator layers interposed; and a land group including a plurality of lands arranged with intervals between each other, and being formed in a rectangular region on a surface layer, among the plurality of conductive layers, when viewed in a direction perpendicular to the surface layer. In the printed wiring board, the land group is arrayed in a triangular lattice manner, and the land group is arranged such that a smallest angle, among angles formed between one side of the rectangular region and respective three sides of the triangular lattice, is 7° or more and 23° or less.

A semiconductor device according to an embodiment of the present invention includes a semiconductor element; a wiring substrate on which the semiconductor element is mounted; and a terminal group including a plurality of terminals arranged with intervals between each other, and being formed in a rectangular region on a surface layer of the wiring substrate when viewed in a direction perpendicular to the surface layer. In the semiconductor device, the terminal group is arrayed in a triangular lattice manner, and the terminal group is arranged such that a smallest angle, among angles formed between one side of the rectangular region and respective three sides of the triangular lattice, is 7° or more and 23° or less.

A printed circuit board according to an embodiment of the present invention includes the printed wiring board described above; and the semiconductor device described above. In the printed circuit board, the terminals of the semiconductor device are coupled to the lands of the printed wiring board.

Further features of the present invention will become apparent from the following description of exemplary embodiments (with reference to the attached drawings).

BRIEF DESCRIPTION OF THE DRAWINGS

FIG. 3A is an explanatory view illustrating the lands of one unit lattice in the region R in FIG. 1B. FIG. 3B is an explanatory view illustrating the unit lattice rotated clockwise by 15° relative to a state in FIG. 3A. FIG. 3C is an explanatory view illustrating the unit lattice rotated clockwise by 30° relative to the state in FIG. 3A. FIG. 3D is an explanatory view illustrating the unit lattice rotated clockwise by 45° relative to the state in FIG. 3A. FIG. 3E is an explanatory view illustrating the unit lattice rotated clockwise by 60° relative to the state in FIG. 3A.

DESCRIPTION OF THE EMBODIMENTS

Figure 1A:
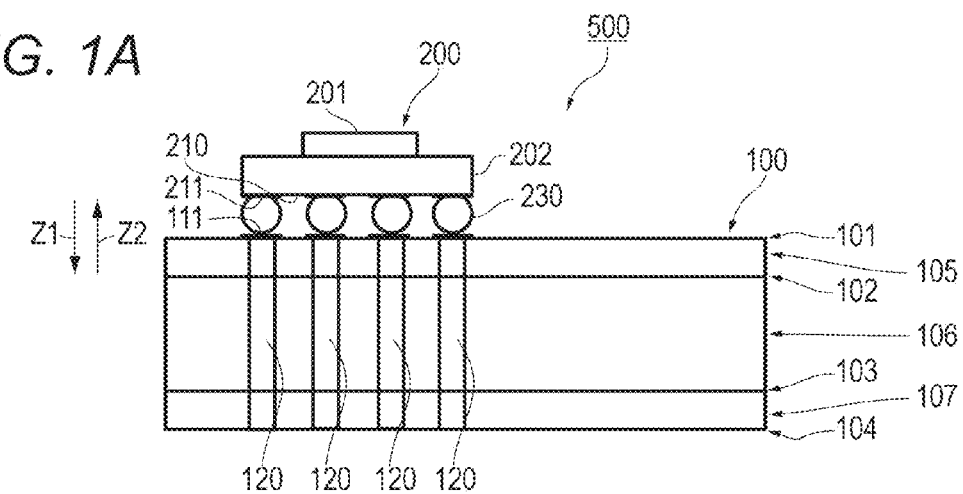
FIG. 1A is a schematic cross-sectional view illustrating a printed circuit board according to an embodiment of the present invention.
Figure 1B:
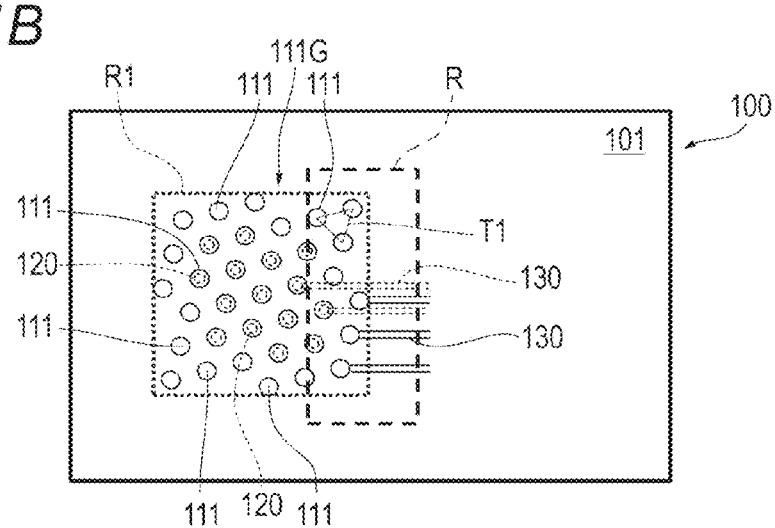
FIG. 1B is a plan view illustrating a surface layer, on which lands are formed, of a printed wiring board according to the embodiment of the present invention.
Figure 1C:
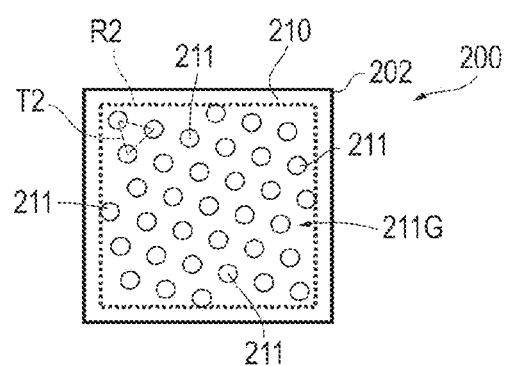
FIG. 1C is a plan view illustrating a surface layer, on which terminals are formed, of a semiconductor device according to the embodiment of the present invention.

Modes for carrying out the present invention will be hereinafter described in detail with reference to the drawings. FIG. 1A is a schematic cross-sectional view illustrating a printed circuit board according to an embodiment of the present invention. FIG. 1B is a plan view illustrating a surface layer, on which lands are formed, of a printed wiring board according to the embodiment of the present invention. FIG. 1C is a plan view illustrating a surface layer, on which terminals are formed, of a semiconductor device according to the embodiment of the present invention.

As illustrated in FIG. 1A, the printed circuit board 500 includes the printed wiring board 100 and a semiconductor package 200 serving as the semiconductor device. The semiconductor package 200 is mounted on one of a pair of surfaces of the printed wiring board 100.

The printed wiring board 100 is a multilayer (in the embodiment, four-layer) printed wiring board, in which multiple conductive layers 101 to 104 are laminated with insulator layers (dielectric layers) 105 to 107 interposed. In the embodiment, a case where the printed wiring board 100 is a four-layer printed wiring board is described; however, the printed wiring board 100 is not limited to four layers and sufficient with two layers or more.

The pair of surfaces of the printed wiring board 100 is surface layers 101 and 104, among the conductive layers 101 to 104 of the printed wiring board 100. Internal layers (conductive layers) 102 and 103 are arranged between the surface layer (conductive layer) 101 and the surface layer (conductive layer) 104 with the insulator layers interposed.

The conductive layers 101 to 104 are layers on which conductive patterns (wiring patterns) are arranged and portions thereof other than conductors are covered with insulators (dielectrics). On the surface layers 101 and 104, solder resists (not illustrated) for covering the conductive patterns are provided. On the internal layers 102 and 103, portions other than the conductive patterns are configured by insulators constituting the insulator layers 105 to 107. In addition, a via 120 including a conductor is provided across the insulator layers 105 to 107 between the conductive layers 101 to 104.

The insulators constituting the insulator layers 105 to 107 only need to have an electrical insulating property and, for example, are cured resin such as epoxy resin. The conductors constituting the conductive patterns formed on the conductive layers 101 to 104 and the via only need to have conductivity and, for example, are metal such as copper or gold.

FIG. 1B is a plan view illustrating the surface layer 101 (surface) when viewed in a direction perpendicular to the surface layer 101 (direction indicated by an arrow Z1 in FIG. 1A). As illustrated in FIG. 1B, a land group 111G including a plurality of lands 111 is formed in a rectangular (including square) region R1 on the surface layer 101 when viewed in the direction indicated by the arrow Z1. The lands 111 constituting the land group 111G are each formed in a circular shape and arranged with intervals between each other. Each land 111 includes the conductive pattern, which is formed so as to be exposed to the outside through the solder resist (not illustrated). The rectangular region R1 is a region with the smallest area among imaginary rectangular regions surrounding the land group 111G.

As illustrated in FIG. 1A, the semiconductor package 200 is mounted on the surface layer 101 of the printed wiring board 100. The semiconductor package 200 includes a semiconductor chip 201 serving as a semiconductor element and a package substrate 202 serving as a wiring substrate, on which the semiconductor chip 201 is mounted.

In the embodiment, a BGA-type semiconductor package is described as the semiconductor package 200; however, the semiconductor package 200 is not limited thereto and an LGA-type semiconductor package or a PGA-type semiconductor package may be used.

FIG. 1C is a plan view illustrating a surface layer 210 (surface) when viewed in a direction perpendicular to the surface layer 210 (direction indicated by an arrow Z2 in FIG. 1A) of the package substrate 202 of the semiconductor package 200. As illustrated in FIG. 1C, a terminal group 211G, including a plurality of lands 211 serving as a plurality of terminals, is formed in a rectangular (including square) region R2 on the surface layer 210 when viewed in the direction indicated by the arrow Z2. The lands 211 constituting the terminal group 211G are each formed in a circular shape and arranged with intervals between each other. Each land 211 includes the conductive pattern, which is formed so as to be exposed to the outside through the solder resist (not illustrated). Each land 211 of the terminal group 211G is arranged at a position overlapping each land 111 of the land group 111G when viewed in the direction indicated by the arrow Z1. The rectangular region R2 is a region with the smallest area among imaginary rectangular regions surrounding the terminal group 211G.

A spherical (ball-like) or pillar-shaped electrode 230 having solder is provided in each land 211 as illustrated in FIG. 1A.

In the embodiment, the semiconductor package 200 prior to being mounted on the printed wiring board 100 has the electrode 230 formed in each land 211. The land 211 and the electrode 230 may form a terminal, or alternatively, the land 211 alone may form a terminal. In any case, when the semiconductor package 200 is mounted on the printed wiring board 100, the land 111 and the land 211 are electrically and mechanically coupled (connected) through the electrode 230.

In the printed wiring board 100 illustrated in FIG. 1A, the via 120 is a conductor formed by filling a through-hole therewith. In this case, the printed wiring board 100 is a build-up substrate and the via 120 is a build via in which filled vias formed in the respective insulator layers 105 to 107 are laminated. In each of the conductive layers 101 to 104, a via land connected to the build via is formed, and particularly in the surface layer 101, a larger land 111 in diameter than the via lands of the other conductive layers 102 to 104 is formed because the electrode 230 is coupled thereto.

A wiring pattern (conductive pattern) 130 is led out toward the outside of the rectangular region R1 on the surface layer 101 from a land 111 located in an outermost periphery, among the plurality of lands 111 constituting the land group 111G. Meanwhile, the wiring pattern (conductive pattern) 130 is led out toward the outside of the rectangular region R1 on the conductive layer 102, 103, or 104 other than the surface layer 101 through the via 120 from a land 111, among the plurality of lands 111, other than the land located in the outermost periphery. All of the plurality of wiring patterns 130 led out from the surface layer 101 and the plurality of wiring patterns 130 led out from the conductive layers 102, 103, and 104 other than the surface layer may be signal lines, or alternatively, may include power supply lines or ground lines in addition to the signal lines.

In the embodiment, the land group 111G and the terminal group 211G are arrayed in a triangular lattice manner within the rectangular regions R1 and R2, respectively. Specifically, the lands 111 and 211 are arrayed so that the central point of each of the lands 111 and 211 is positioned at a lattice point of the triangular lattice.

Unit lattices (unit cells) T1 and T2, each of which is the smallest unit of the triangular lattice, have triangular shapes (equilateral triangles) when viewed in a Z1 direction and a Z2 direction, respectively. Specifically, the lands 111 and 211 are arranged within the rectangular regions R1 and R2, respectively, so that the lands 111 being adjacent to each other and the lands 211 being adjacent to each other each form the equilateral triangle. The plurality of lands 111 constituting the land group 111G fills the rectangular region R1 with the smallest allowable intervals therebetween so as to be the closest packing (so-called hexagonal close-packed structure). Likewise, the plurality of lands 211 constituting the terminal group 211G fills the rectangular region R2 with the smallest allowable intervals therebetween so as to be the closest packing. In this manner, as many of the lands 111 (the lands 211) as possible are arrayed in the rectangular region R1 (the rectangular region R2).

Figure 2A:
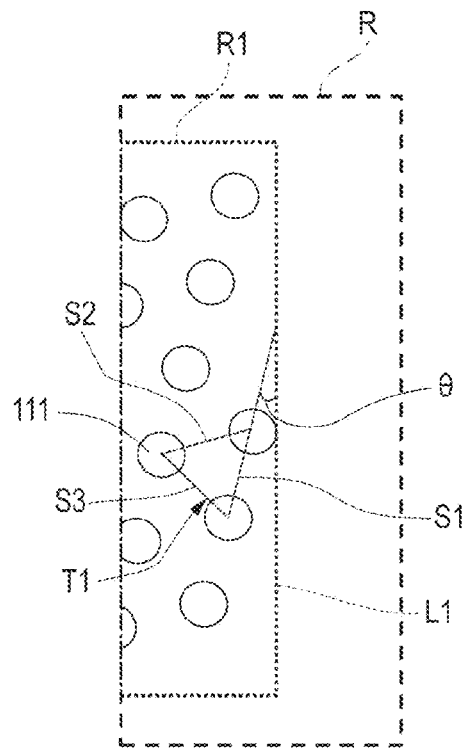
FIG. 2A is an enlarged view illustrating an arrangement of the lands in a region R in FIG. 1B.

Next, an arrangement of the land group 111G will be described in detail. Note that the terminal group 211G when viewed in the Z2 direction has a line-symmetric layout in relation to the land group 111G when viewed in the Z1 direction, and thus the description thereof will be omitted. FIG. 2A is an enlarged view illustrating an arrangement of the lands 111 in the region R in FIG. 1B. In FIG. 2A, a straight line including one of four sides of the rectangular region R1 is denoted by L1. In addition, straight lines each including one side of the equilateral triangular unit lattice T1 are denoted by S1, S2, and S3. The smallest angle, among angles formed between the straight line L1 and the respective straight lines S1, S2, and S3, is an angle formed between the straight line L1 and the straight line S1 in FIG. 2A and denoted by θ. The straight line L1 and the straight line S1 form an acute angle and an obtuse angle, among which the angle θ is the acute angle.

A possible range of the angle θ depending on the arrangement of the land group 111G is from 0° to 30°. When the angle θ is 0°, the straight line L1 and the straight line S1 are parallel.

Figure 2B:
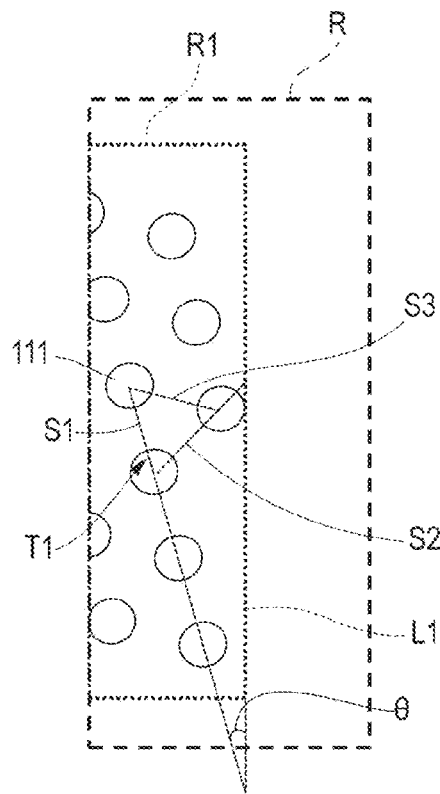
FIG. 2B is an enlarged view illustrating another arrangement of the lands in the region R in FIG. 1B.

FIG. 2B is an enlarged view illustrating another arrangement of the lands 111 in the region R in FIG. 1B. As illustrated in FIG. 2B, the smallest angle is an angle formed between one of the three straight lines S1, S2, and S3 (in FIG. 2B, the straight line S1) and the straight line L1. The smallest angle, that is, the angle θ ranges from 0° to 30°.

Next, the unit lattice T1 will be described in the case of being rotated relative to the rectangular region R1. FIG. 3A is an explanatory view illustrating the lands 111 of the one unit lattice T1 in the region R in FIG. 1B. In FIG. 3A, the angle θ is 0°. FIG. 3B is an explanatory view illustrating the unit lattice T1 rotated clockwise by 15° relative to a state in FIG. 3A. FIG. 3C is an explanatory view illustrating the unit lattice T1 rotated clockwise by 30° relative to the state in FIG. 3A. FIG. 3D is an explanatory view illustrating the unit lattice T1 rotated clockwise by 45° relative to the state in FIG. 3A. FIG. 3E is an explanatory view illustrating the unit lattice T1 rotated clockwise by 60° relative to the state in FIG. 3A.

When the state in FIG. 3A is rotated clockwise by 30° to a state in FIG. 3C, the angle θ monotonously increases from 0° to 30°. When the state in FIG. 3C is further rotated clockwise by 30° to a state in FIG. 3E, the angle θ is then defined by the straight line S3, which is another side of the equilateral triangular unit lattice T1, and the straight line L1. In this case, the angle θ monotonously decreases from 30° to 0°. Additionally, the state illustrated in FIG. 3E returns to the same state as FIG. 3A, that is, the angle θ being 0°. The angle θ will be in the same state even when being rotated by more than 60°. According to the above, it is understood that the angle θ is sufficiently examined with the range from 0° to 30°.

A range for which a difference in the number of leading wires caused between leading directions can be reduced in the printed wiring board 100 will be then described for the range of the angle θ from 0° to 30°.

Figure 4A:
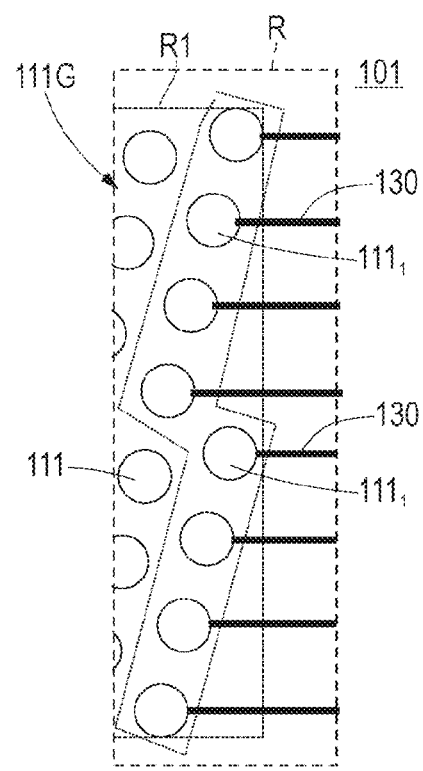
FIG. 4A is an enlarged view illustrating the region R1 in FIG. 1B on the surface layer of the printed wiring board.

FIG. 4A is an enlarged view illustrating the region R1 in FIG. 1B on the surface layer 101 of the printed wiring board 100. For easy understanding of the description, the number of the lands 111 in FIG. 4A is different from that in FIG. 1B.

The wiring pattern 130 is led out toward the outside of the rectangular region R1 on the surface layer 101 from each of lands $111_1$ located in the outermost periphery (the lands in a region surrounded by a dotted line in FIG. 4A), among the plurality of lands 111 constituting the land group 111G.

For simple description, a case where the wire is led out from the land $111_1$ located in the outermost periphery on the surface layer 101 will be described, and because the description is possible by the same theory for wires led out from the internal layers 102 and 103 when the land 111 is read as the via land, the description thereof will be omitted.

According to FIG. 4A, the number of the wiring patterns 130 led out from one side of the region R1 of the land group 111G surrounded by a rectangle is determined by the number of the lands $111_1$ in the outermost periphery arranged within one side of the semiconductor package 200.

Under a condition in FIG. 4A, no wiring pattern 130 can be led out between the lands $111_1$ and $111_1$. That is, when an interval between the lands 111 and 111 being adjacent to each other is minimized, the wiring pattern 130 cannot be led out between the lands $111_1$ and $111_1$. In the layers 102, 103, and 104 other than the surface layer 101, the via land is smaller in diameter than the land 111 to which the electrode 230 is coupled, and thus, the wiring pattern 130 can be led out between the vias 120 and 120 (between the via lands). The interval between the lands 111 and 111 may be extended so that the wiring pattern 130 can be led out between the lands $111_1$ and $111_1$.

Figure 4B:
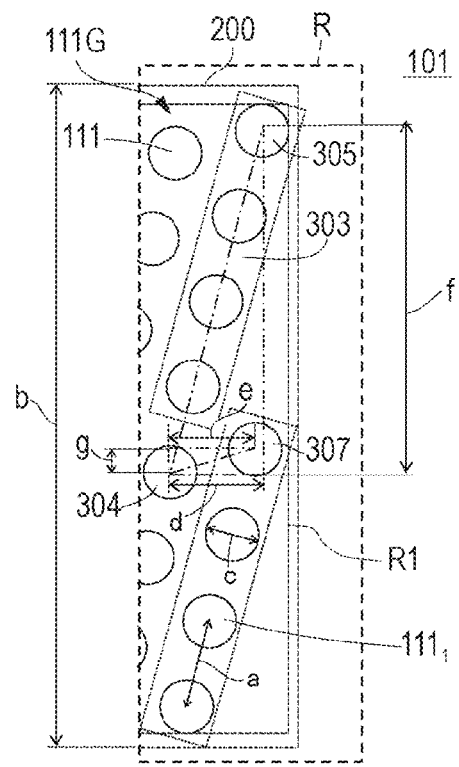
FIG. 4B is an explanatory view illustrating the lands located in an outermost periphery.

FIG. 4B is an explanatory view illustrating the lands located in the outermost periphery. The number of the lands $111_1$, out of the land group 111G, in the outermost periphery arranged in one side is obtained. For the lands $111_1$ in the outermost periphery arranged in one side, there are a linearly-arranged portion 303 and a stepped portion. The number k of the lands $111_1$ in the outermost periphery arranged in one side can be obtained from a product of the number i of the lands in the linearly-arranged portion 303 and the number j of the linearly-arranged portions 303.

$$k = i \times j \quad \text{(Formula 1)}$$

For example, in FIG. 4B, the number of the lands in the linearly-arranged portion 303 is four and the number of the linearly-arranged portions 303 is two; accordingly, the number of the lands $111_1$ in the outermost periphery arranged in one side can be obtained as eight.

Hereinafter, respective methods for obtaining the numbers i and j will be described. In FIG. 4B, it is assumed that a diameter of the land 111 is c [mm], a distance between the centers thereof is a [mm], and a length of each side of a square-shaped external form of the semiconductor package 200 is b [mm]. The region R1 has a similar external form to the external form of the semiconductor package 200. Although the external form of the region R1 is slightly smaller than the external form of the semiconductor package 200, the maximum number of the lands that can be arranged in a region of the semiconductor package 200 is the same as that in the region R1.

The land group 111G includes a land 304 linearly-arranged but not in the outermost periphery, and a land 305 linearly-arranged as a first land in the outermost periphery. With respect to one side of the region of the land group 111G surrounded by a rectangle, a vertical distance between the land 304 and the land 305 is assumed as d [mm], and a horizontal distance between the land 304 and the land 305 is assumed as f [mm]. A vertical distance between the land 304 and a land 307, which is a first land in the stepped portion, is assumed as e [mm], and a horizontal distance between the land 304 and the land 307 is assumed as g [mm]. A difference between the distance f and the distance g is assumed as a distance h [mm].

First, the number i is obtained. The lands 111 are blocked from being linearly arranged relative to the external form of the semiconductor package 200 when the land 307 appears, that is, when the distance d and the distance e satisfy a relationship expressed as follows:

$$d - e \geq 0 \quad \text{(Formula 2)}$$

The distances d and e are expressed as follows:

$$d = ai \sin \theta \quad \text{(Formula 3)}$$

$$e = a \cos(30° - \theta) \quad \text{(Formula 4)}$$

From (Formula 2), (Formula 3), and (Formula 4), the following formula is obtained:

$$ai \sin \theta - a \cos(30° - \theta) \geq 0 \quad \text{(Formula 5)}$$

From (Formula 5), the number i of the lands is expressed as follows:

$$i = \frac{\cos(30° - \theta)}{\sin \theta} \quad \text{(Formula 6)}$$

The lands in the outermost periphery are blocked from being linearly arranged from a time when the number i of the lands satisfies (Formula 6).

The number i of the lands is an integer; however, because rounding-up and rounding-down are carried out in some cases, the number i of the lands is treated as values including decimals for calculation.

Next, the number j is obtained. The distance h is a difference between the distance f and the distance g.

$$f = ai \cos \theta \quad \text{(Formula 7)}$$

$$g = a \sin(30° - \theta) \quad \text{(Formula 8)}$$

From (Formula 7) and (Formula 8), the following formula is obtained:

$$h = ai \cos \theta - a \sin(30° - \theta) \quad \text{(Formula 9)}$$

A region in which the lands can be arranged is a region in which the distance between the centers of the lands is smaller than the length b by the diameter c of the land. Therefore, the number j is expressed as follows:

$$j = \frac{b - c}{h} \quad \text{(Formula 10)}$$

$$= \frac{b - c}{ai \cos \theta - a \sin(30° - \theta)}$$

$$= \frac{b - c}{\frac{\cos(30° - \theta)}{\sin \theta} \times a \cos \theta - a \sin(30° - \theta)}$$

The number k of the lands arranged in one side can be obtained from a product of the number of times the lands in the outermost periphery are blocked from being linearly arranged and the number i of the lands, using (Formula 1). Consequently, from (Formula 1), (Formula 6), and (Formula 10), the number k of the lands arranged in one side is expressed as follows:

$$k = \frac{\cos(30° - \theta)}{\sin \theta} \times \frac{b - c}{\frac{\cos(30° - \theta)}{\sin \theta} \times a \cos \theta - a \sin(30° - \theta)} \quad \text{(Formula 11)}$$

Note that, when the angle θ is 0°, a limiting value in which the angle θ is assumed as 0° is used in (Formula 11).

Figure 5A:
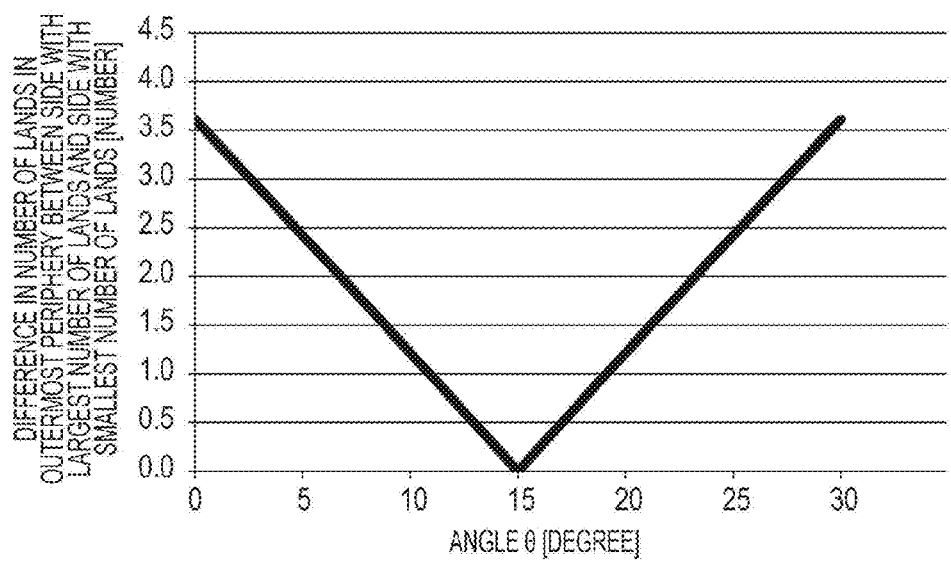
FIG. 5A is a graph illustrating a relationship between an angle θ and a difference in the number of the lands in the outermost periphery between a side with the largest number of the lands and a side with the smallest number of the lands.
Figure 5B:
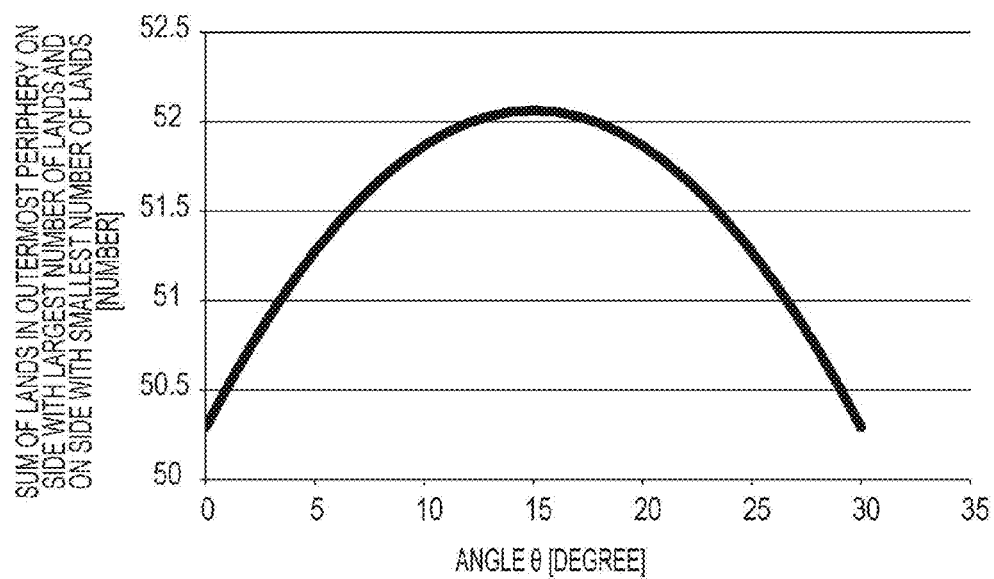
FIG. 5B is a graph illustrating a relationship between the angle θ and a sum of the lands in the outermost periphery on the side with the largest number of the lands and on the side with the smallest number of the lands.

FIG. 5A is a graph illustrating a relationship between the angle θ and a difference in the number of the lands in the outermost periphery between a side with the largest number of the lands and a side with the smallest number of the lands, in the case of a (land interval)=0.5 [mm], b (side length of semiconductor package)=12 [mm], and c (land diameter)=0.33 [mm]. FIG. 5B is a graph illustrating a relationship, under the same conditions, between the angle θ and a sum of the lands in the outermost periphery on the side with the largest number of the lands and on the side with the smallest number of the lands.

According to FIG. 5B, when the angle θ approaches 15°, the sum of the lands increases. According to FIG. 5A, when the angle θ is in a range of 7° or more and 23° or less, the difference in the number of the lands is two or less. When the difference in the number of the lands is two or less, a difference in the number of leading wires caused by the difference in the number of the lands can be absorbed with the leading directions of the wires led out from the lands 111 in a vicinity of four corners of the semiconductor package 200.

Accordingly, the land group 111G of the embodiment is arranged so that the angle θ is in a range of 7° or more and 23° or less. By arranging in this manner, the difference in the number of leading wires can be reduced in the rectangular region R1 between upper/lower side directions and left/right side directions in FIG. 1B. In other words, it is possible to reduce a difference between the number of the wiring patterns 130 led out from one side of the rectangular region R1 and the number of the wiring patterns 130 led out from one side being adjacent to the aforementioned side. With this, the degree of freedom in design of the wiring patterns 130 can be improved in the printed wiring board 100. Furthermore, it is possible to increase the number of the wiring patterns 130 that can be led out toward the outside of the region R1 from the lands 111 constituting the land group 111G.

In the semiconductor package 200, the terminal group 211G when viewed in the Z2 direction is arranged in line symmetry with respect to the land group 111G when viewed in the Z1 direction. Accordingly, in FIG. 1C, the terminal group 211G is arranged so that a smallest angle, among angles formed between one side of the rectangular region R2 and respective three sides of the triangular lattice, is 7° or more and 23° or less. By using such semiconductor package 200, the degree of freedom in design of the leading wiring patterns 130 can be improved and the number of the leading wiring patterns 130 can be increased in the printed wiring board 100.

In addition, when the angle θ is 15°, the maximum number of the wiring patterns 130 that can be led out toward the outside of the region R1 from the lands 111 is reached. Therefore, the number of the wiring patterns 130 that can be led out toward the outside of the region R1 from the lands 111 can be increased more effectively. In the case of the region R1 being a square, the number of the wiring patterns 130 led out from one side of the region R1 can be the same as the number of the wiring patterns 130 led out from one side being adjacent to the aforementioned side.

In this case, also in the terminal group 211G of the semiconductor package 200, the angle θ can be set to 15° to more effectively increase the number of the wires that can be led out in the printed wiring board 100. Furthermore, when the region R2 is a square in accordance with the region R1, the number of the wiring patterns 130 led out from one side of the region R1 can be the same as the number of the wiring patterns 130 led out from one side being adjacent to the aforementioned side in the printed wiring board 100.

According to the embodiment as described thus far, the difference in the number of leading wires caused between the leading directions can be reduced in the printed wiring board 100 while a terminal density (land density) per unit area is maintained. With this, the degree of freedom in design of the wiring patterns 130 can be improved and the total number of the led-out wiring patterns 130 can be increased.

Hereinafter, a result of comparison between an exemplary embodiment in which the angle θ is 15° and a comparative example in which the angle θ is 0° will be described.

Exemplary Embodiment

A printed wiring board 100 according to the exemplary embodiment has four layers. An interval between lands 111 and an interval between vias 120 are 0.5 [mm]. In this exemplary embodiment, the via 120 is a build via.

A length of each side of a semiconductor package 200 (package substrate 202) is 12 [mm]. That is, a land group 111G is arranged in a square region. A wiring width in a conductive layer 101 serving as a surface layer is 0.075 [mm]. A smallest wiring interval in the conductive layer 101 is 0.075 [mm]. Wiring widths in conductive layers 102 to 104 are 0.06 [mm]. Smallest wiring intervals in the conductive layers 102 to 104 are 0.07 [mm]. A diameter of the land 111 on the conductive layer 101 serving as a surface layer is 0.3 [mm]. Diameters of the vias on the conductive layers 102 to 104 are 0.275 [mm].

In a method for leading out the wiring patterns 130, a plurality of the conductive layers 101 to 104 in the printed wiring board 100 is used to sequentially lead out the wiring patterns 130 starting from the lands 111 (vias 120) on the outside.

Figure 6A:
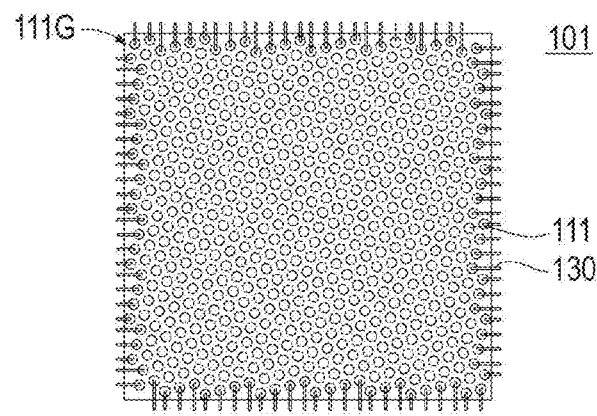
FIG. 6A is a plan view illustrating a first conductive layer of a printed wiring board according to an exemplary embodiment.
Figure 6B:
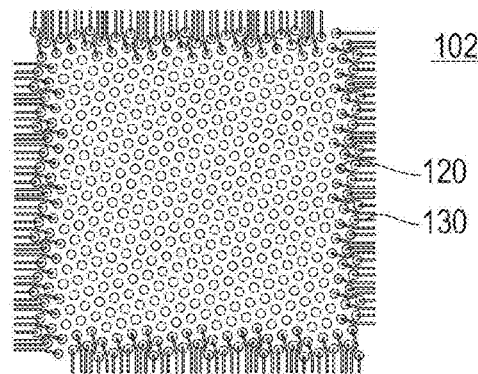
FIG. 6B is a plan view illustrating a second conductive layer of the printed wiring board according to the exemplary embodiment.
Figure 6C:
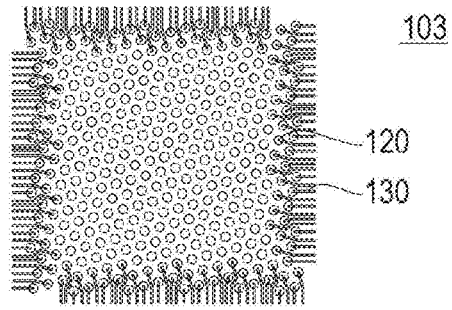
FIG. 6C is a plan view illustrating a third conductive layer of the printed wiring board according to the exemplary embodiment.
Figure 6D:
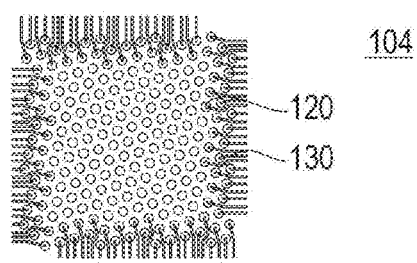
FIG. 6D is a plan view illustrating a fourth conductive layer of the printed wiring board according to the exemplary embodiment.

FIG. 6A is a plan view illustrating a conductive layer (first conductive layer) 101 of the printed wiring board 100 according to the exemplary embodiment. FIG. 6B is a plan view illustrating a conductive layer (second conductive layer) 102 of the printed wiring board 100 according to the exemplary embodiment. FIG. 6C is a plan view illustrating a conductive layer (third conductive layer) 103 of the printed wiring board 100 according to the exemplary embodiment. FIG. 6D is a plan view illustrating a conductive layer (fourth conductive layer) 104 of the printed wiring board 100 according to the exemplary embodiment.

The land group 111G is arranged so that the lands 111 being adjacent to each other form an equilateral triangle. A wiring pattern 130 led out toward the outside of a region R1 is connected to the land 111. The via 120 is formed at a position overlapping the land 111 when viewed in a direction perpendicular to a surface of the printed wiring board 100. The vias 120 being adjacent to each other are arranged so as to form an equilateral triangle. The via 120 is led out through the wiring pattern 130.

The land 111 (via 120) is capable of being led out in multiple directions, and the leading directions are uniformly made four directions.

Specifically, as illustrated in FIG. 6A, in the conductive layer 101, the number of the wiring patterns 130 that can be led out is 25 in the respective upper and lower side directions and 25 in the respective left and right side directions. As illustrated in FIG. 6B, in the conductive layer 102, the number of the wiring patterns 130 that can be led out is 43 in the respective upper and lower side directions and 43 in the respective left and right side directions. As illustrated in FIG. 6C, in the conductive layer 103, the number of the wiring patterns 130 that can be led out is 36 in the respective upper and lower side directions and 35 in the respective left and right side directions. As illustrated in FIG. 6D, in the conductive layer 104, the number of the wiring patterns 130 that can be led out is 26 in the respective upper and lower side directions and 26 in the respective left and right side directions.

A land 111, out of the land group 111G, not led out though the wiring pattern 130 can be connected to a power supply pattern or a ground pattern (not illustrated). In this case, it is desirable for the printed wiring board 100 to include an additional conductive layer other than the conductive layers 101 to 104, and the power supply pattern or the ground pattern may be formed on the additional conductive layer.

The total number of the wires that can be led out in the four layers is 260 in the upper and lower side directions and 258 in the left and right side directions; accordingly, a difference in the number of the led-out wiring patterns 130 is two. The total number of the led-out wiring patterns 130 in the upper/lower side directions and the left/right side directions is 518.

Comparative Example

Figure 7A:
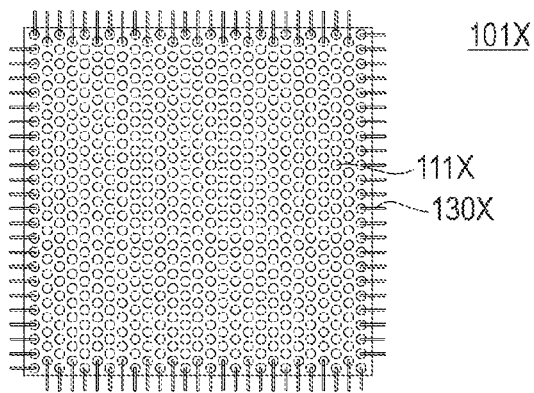
FIG. 7A is a plan view illustrating a first conductive layer of a printed wiring board according to a comparative example.
Figure 7B:
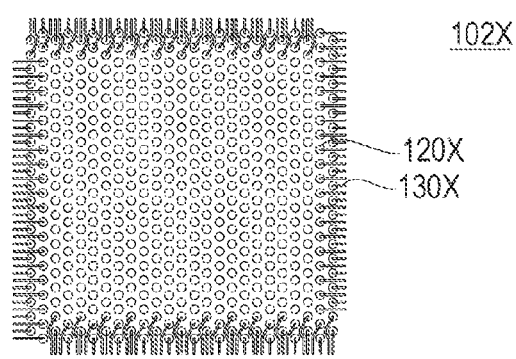
FIG. 7B is a plan view illustrating a second conductive layer of the printed wiring board according to the comparative example.
Figure 7C:
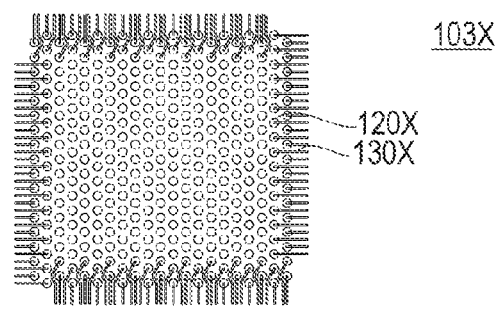
FIG. 7C is a plan view illustrating a third conductive layer of the printed wiring board according to the comparative example.
Figure 7D:
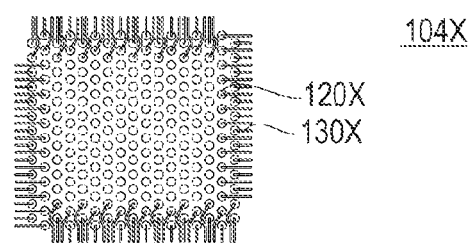
FIG. 7D is a plan view illustrating a fourth conductive layer of the printed wiring board according to the comparative example.

A printed wiring board according to the comparative example has four layers. FIG. 7A is a plan view illustrating a conductive layer (first conductive layer) 101X of the printed wiring board according to the comparative example. FIG. 7B is a plan view illustrating a conductive layer (second conductive layer) 102X of the printed wiring board according to the comparative example. FIG. 7C is a plan view illustrating a conductive layer (third conductive layer) 103X of the printed wiring board according to the comparative example. FIG. 7D is a plan view illustrating a conductive layer (fourth conductive layer) 104X of the printed wiring board according to the comparative example.

Lands 111X illustrated in FIG. 7A are arranged with the angle θ being 0° (30°) and a land group is arranged so that the lands 111X being adjacent to each other form an equilateral triangle. A wiring pattern 130X led out toward the outside of a rectangular region surrounding the land group is connected to the land 111X.

A via 120X is formed at a position overlapping the land 111X when viewed in a direction perpendicular to a surface of the printed wiring board. The vias 120X being adjacent to each other are arranged so as to form an equilateral triangle. The via 120X is led out through the wiring pattern 130X.

The land 111X (via 120X) is capable of being led out in multiple directions, and the leading directions are uniformly made four directions.

Specifically, as illustrated in FIG. 7A, in the conductive layer 101X, the number of the wiring patterns 130X that can be led out is 26 in the respective upper and lower side directions and 23 in the respective left and right side directions. As illustrated in FIG. 7B, in the conductive layer 102X, the number of the wiring patterns 130X that can be led out is 47 in the respective upper and lower side directions and 38 in the respective left and right side directions. As illustrated in FIG. 7C, in the conductive layer 103X, the number of the wiring patterns 130X that can be led out is 39 in the respective upper and lower side directions and 30 in the respective left and right side directions. As illustrated in FIG. 7D, in the conductive layer 104X, the number of the wiring patterns 130X that can be led out is 31 in the respective upper and lower side directions and 22 in the respective left and right side directions.

The total number of the wires that can be led out in the four layers is 286 in the upper and lower side directions and 226 in the left and right side directions; accordingly, a difference in the number of the led-out wiring patterns 130X is 60. The total number of the led-out wiring patterns 130X in the upper/lower side directions and the left/right side directions is 512.

When the exemplary embodiment of which the angle θ is 15° is compared with the comparative example of which the angle θ is 0°, a difference in the number of the led-out wiring patterns 130 can be reduced by 58 in the exemplary embodiment relative to the comparative example. Furthermore, the total number of leading wires can be increased by six in the exemplary embodiment relative to the comparative example.

The present invention is not limited to the embodiment described above and a large number of modifications can be made within the scope of the technical concept of the present invention.

Effects obtained by the printed circuit board 500 according to the aforementioned embodiment are not limited to a mode of the aforementioned exemplary embodiment. In addition, the via 120 is not limited to the build via. Also, the semiconductor package 200 has been described assuming that the external form thereof is a square, but the external form is not limited to a square. Any form can be employed as long as the region R1 (region R2) surrounding the land group 111G (terminal group 211G) is a rectangle (including a square). Furthermore, the effects are not limited to the case of the printed circuit board 500, and may be obtained by the printed wiring board 100 alone on which the semiconductor package 200 is not mounted, or by the semiconductor package 200 alone not mounted on the printed wiring board 100.

ADVANTAGEOUS EFFECT OF THE INVENTION

According to an embodiment of the present invention, the number of the wiring patterns that can be led out is increased and the degree of freedom in wiring design is improved in the printed wiring board on which the semiconductor device is mounted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-234445, filed Nov. 19, 2014, which is hereby incorporated by reference herein in its entirety.

What is claimed is:
1. A printed wiring board, comprising:
a plurality of conductive layers laminated with insulator layers interposed; and
a land group including a plurality of lands arranged with intervals between each other, and being formed in a rectangular region on a surface layer, among the plurality of conductive layers, when viewed in a direction perpendicular to the surface layer, wherein
the land group is arrayed in a triangular lattice manner, and
the land group is arranged such that a smallest angle, among angles formed between one side of the rectangular region and respective three sides of the triangular lattice, is 7° or more and 23° or less.

2. The printed wiring board according to claim 1, wherein the smallest angle is 15°.

3. The printed wiring board according to claim 1, wherein
a wire is led out toward the outside of the rectangular region on the surface layer from a land, out of the land group, located in an outermost periphery, and
a wire is led out toward the outside of the rectangular region on each of the conductive layers other than the surface layer through a via from a land other than the land located in the outermost periphery.

4. An electronic apparatus, comprising the printed wiring board according to claim 1.

5. A semiconductor device, comprising:
a semiconductor element;
a wiring substrate on which the semiconductor element is mounted; and
a terminal group including a plurality of terminals arranged with intervals between each other, and being formed in a rectangular region on a surface layer of the wiring substrate when viewed in a direction perpendicular to the surface layer,
wherein the terminal group is arrayed in a triangular lattice manner, and
the terminal group is arranged such that a smallest angle, among angles formed between one side of the rectangular region and respective three sides of the triangular lattice, is 7° or more and 23° or less.

6. The semiconductor device according to claim 5, wherein the smallest angle is 15°.

7. An electronic apparatus, comprising the semiconductor device according to claim 5.

8. A printed circuit board, comprising:
a printed wiring board including a plurality of lands arranged in a rectangular region with intervals between each other; and
a semiconductor device including a plurality of terminals arranged, in a region corresponding to the rectangular region, in line symmetry with respect to an arrangement of the plurality of lands,
wherein the plurality of lands and the plurality of terminals are each arrayed in a triangular lattice manner, and are arranged so that a smallest angle, among angles formed between one side of the rectangular region or one side of the region corresponding to the rectangular region, and respective three sides of the triangular lattice, is 7° or more and 23° or less, and
wherein each of the plurality of terminals is electrically connected to corresponding one of the plurality of lands.

9. an electronic apparatus, comprising the printed circuit board According to claim 8.

* * * * *